(12) United States Patent
Lee (10) Patent No.: US 7,227,795 B2
(45) Date of Patent: Jun. 5, 2007

(54) DATA OUTPUT CIRCUIT, DATA OUTPUT METHOD, AND SEMICONDUCTOR MEMORY DEVICE

(75) Inventor: Jae-Hyung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/316,848

(22) Filed: Dec. 22, 2005

(65) Prior Publication Data

US 2006/0140022 A1    Jun. 29, 2006

(30) Foreign Application Priority Data

Dec. 24, 2004    (KR) ...................... 10-2004-0112332

(51) Int. Cl.
  *G11C 7/00*    (2006.01)
(52) U.S. Cl. ...................... 365/193; 365/194; 365/233; 327/155
(58) Field of Classification Search ................. 365/193
See application file for complete search history.

(56) References Cited

U.S. PATENT DOCUMENTS

| 6,191,632 | B1 * | 2/2001 | Iwata et al. ................ 327/295 |
| 6,426,900 | B1 * | 7/2002 | Maruyama et al. ......... 365/194 |
| 6,509,776 | B2 * | 1/2003 | Kobayashi et al. ......... 327/277 |
| 6,552,587 | B2 * | 4/2003 | Kim et al. ................... 327/158 |
| 6,720,807 | B1 * | 4/2004 | Kubo et al. ................. 327/141 |
| 6,803,826 | B2 * | 10/2004 | Gomm et al. ................. 331/11 |
| 6,894,945 | B2 * | 5/2005 | Sawada ....................... 365/233 |
| 6,944,089 | B2 * | 9/2005 | Jeong et al. ................. 365/233 |
| 6,985,401 | B2 * | 1/2006 | Jang et al. ................... 365/233 |
| 7,068,084 | B2 * | 6/2006 | Byun et al. .................. 327/158 |
| 7,137,022 | B2 * | 11/2006 | Ishikawa ..................... 713/400 |
| 2005/0254318 | A1 | 11/2005 | Jang et al. ................... 365/194 |

FOREIGN PATENT DOCUMENTS

| KR | 10-2002-0059229 | 7/2002 |
| KR | 10-2003-0011677 | 2/2003 |
| KR | 10-0546135 | 1/2006 |

* cited by examiner

*Primary Examiner*—Son L. Mai
(74) *Attorney, Agent, or Firm*—Mills & Onello LLP (57) ABSTRACT

In a data output circuit, a data output method, and a semiconductor memory device, the data output circuit includes: an internal clock generation unit that delays an external clock signal by a first delay time to output an internal clock signal in response to the external clock signal and a replica data strobe signal; a data strobe signal output unit that outputs a data strobe signal in response to the internal clock signal; and a data strobe signal replication unit that delays the internal clock signal by a second delay time to output the replica data strobe signal and changing the second delay time in response to the data strobe signal and the replica data strobe signal. Accordingly, it is possible to save time and effort required for setting a delay time of a data strobe signal replication unit. In addition, it is possible to correct differences between packages of the delay time of the data strobe signal output unit.

14 Claims, 7 Drawing Sheets

DATA OUTPUT CIRCUIT, DATA OUTPUT METHOD, AND SEMICONDUCTOR MEMORY DEVICE

CROSS-REFERENCE TO RELATED PATENT APPLICATION

This application claims the benefit of Korean Patent Application No. 10-2004-0112332, filed on Dec. 24, 2004, in the Korean Intellectual Property Office, the disclosure of which is incorporated herein in its entirety by reference.

BACKGROUND OF THE INVENTION

1. Field of the Invention

The present invention relates to a data output circuit, and more particularly, to a data output circuit employing a delay locked loop used in a synchronous semiconductor device.

2. Description of the Related Art

In general, synchronous semiconductor devices output data in synchronization with an external clock signal. For the synchronization, delay locked loops (DLLs) including a delay unit and a phase detection unit have been widely used. The delay locked loop delays the external clock signal by a predetermined time period to generate an internal clock signal. More specifically, the phase detection unit detects a phase difference between the external clock signal and a replica data strobe signal output from a data strobe signal replication unit. The delay unit changes the delay time in response to the phase difference detected by the phase detection unit and delays the external clock signal by the changed delay time to generate the internal clock signal. The data strobe signal replication unit delays the internal clock signal by a predetermined time period to output the replica data strobe signal. Here, by using the internal clock signal, the delay time of the data strobe signal replication unit is set to be equal to the delay time of the data strobe signal output unit for outputting the data strobe signal.

Figure 1:
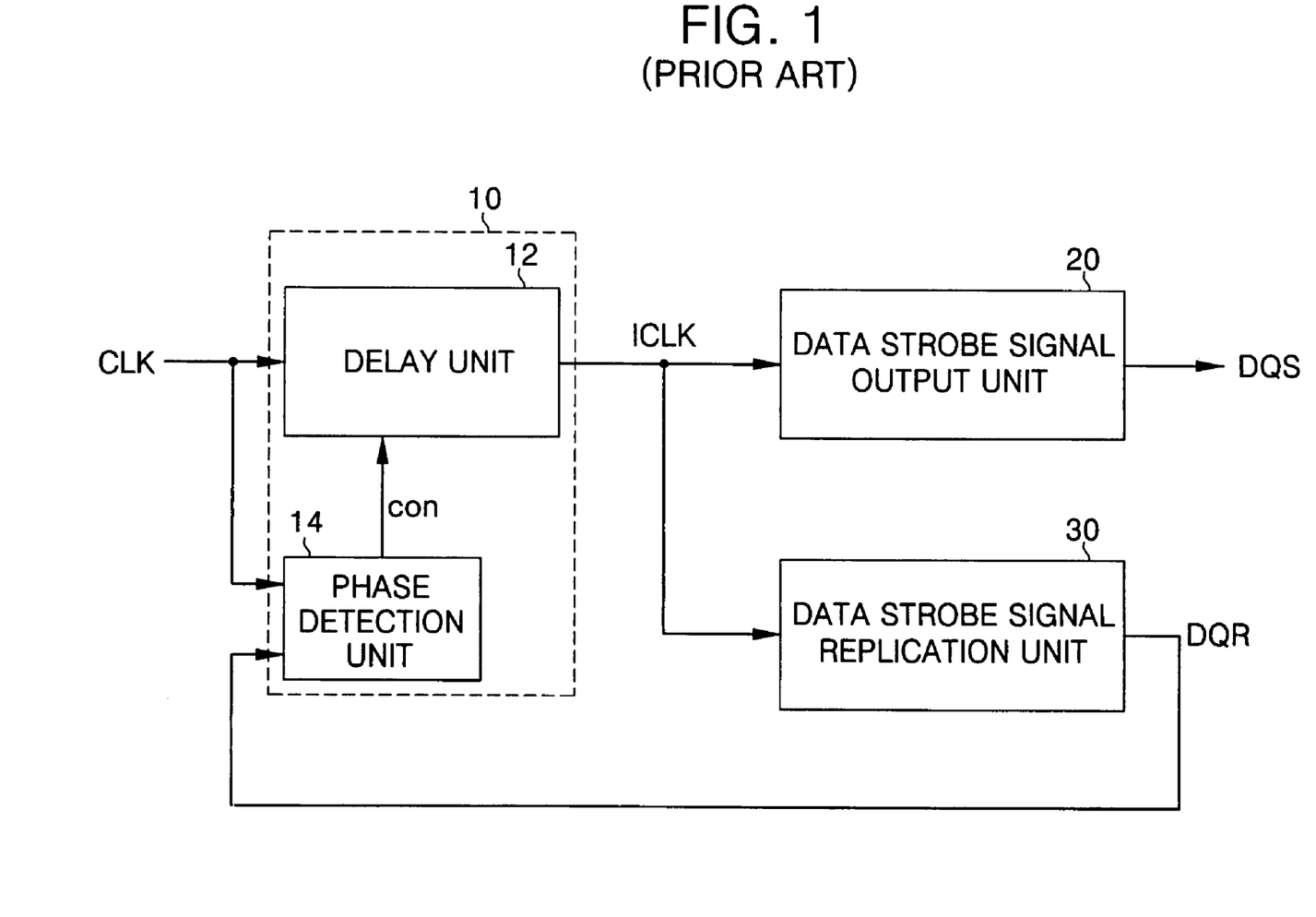
FIG. 1 is a block diagram of a conventional data output circuit.

FIG. 1 is a block diagram showing a conventional data output circuit. The conventional data output circuit comprises an internal clock generation unit 10 including the DLL circuit, a data strobe signal output unit 20, and a data strobe signal replication unit 30. The internal clock generation unit 10 is constructed using a delay unit 12 and a phase detection unit 14.

Now, functions of the blocks shown in FIG. 1 will be described.

In response to an external clock signal CLK externally input and a replica data strobe signal DQR output from the data strobe signal replication unit 30, the internal clock generation unit 10 delays the external clock signal CLK by a first delay time to output an internal clock signal ICLK.

The phase detection unit 14 compares a phase of the external clock signal CLK with a phase of the replica data strobe signal DQR to output a control signal con. In response to the control signal con, the delay unit 12 changes the first delay time and delays the external clock signal CLK by the changed first delay time to output the internal clock signal ICLK. In other words, the delay time of the delay unit 12 is adjusted by the control signal con.

The data strobe signal output unit 20 outputs the data strobe signal DQS by using the internal clock signal ICLK. At this time, the internal clock signal ICLK is delayed through a predetermined number of gate stages in the data strobe signal output unit 20. Therefore, the output data strobe signal DQS is delayed by a predetermined time with reference to the internal clock signal ICLK. In general, in a semiconductor device, the delay time of the data strobe signal output unit 20 is set so that the data strobe signal DQS can be synchronized with the output data signal.

The data strobe signal replication unit 30 delays the internal clock signal ICLK by the delay time of the data strobe signal output unit 20, that is, a time by which the data strobe signal DQS is delayed with reference to the internal clock signal ICLK in the data strobe signal output unit 20, and outputs the replica data strobe signal DQR.

Figure 2:
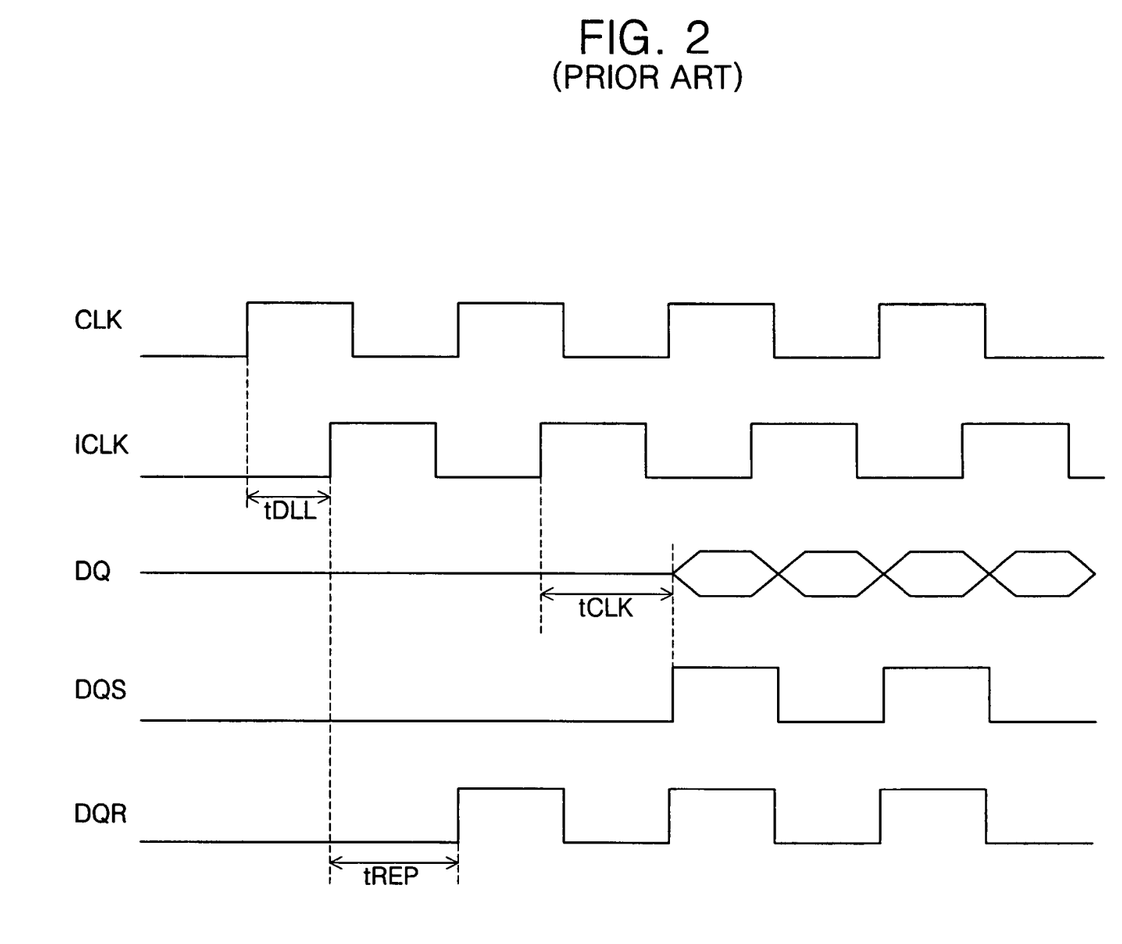
FIG. 2 is an operational timing diagram for explaining operations of the conventional data output circuit shown in FIG. 1.

FIG. 2 is an operational timing diagram for explaining operations of the conventional data output circuit shown in FIG. 1. In FIG. 2, CLK denotes an external clock signal, ICLK denotes an internal clock signal, DQ denotes a data signal, DQS denotes a data strobe signal, and DQR denotes a replica data strobe signal. In addition, in FIG. 2, tDLL denotes a first delay time, that is, a time by which the external clock signal CLK is delayed through the internal clock signal generation unit 10; tCLK denotes a time by which the data strobe signal DQS is delayed with reference to the internal clock signal ICLK in data strobe signal output unit 20; and tREP denotes a second delay time, that is, a time by which the internal clock signal ICLK is delayed through the data strobe signal replication unit 30.

Now, the operations of the conventional data output circuit will be described with reference to FIG. 2.

The delay unit 12 delays the external clock signal CLK by the first delay time tDLL to output the internal clock signal ICLK. As described above, the first delay time tDLL is adjusted by the control signal con output from the phase detection unit 14.

The data strobe signal output unit 20 uses the internal clock signal ICLK to output the data strobe signal DQS. At this time, the output data strobe signal DQS is delayed by a predetermined time tCLK with reference to the internal clock signal ICLK. Here, the data strobe signal output unit 20 is designed so that the phase of the output data strobe signal DQS can be equal to the phases of the data signals DQ.

The data strobe signal replication unit 30 delays the internal clock signal ICLK by the second delay time tREP to output the replica data strobe signal DQR. Here, the data strobe signal replication unit 30 is designed so that the second delay time tREP can be equal to the delay time tCLK of the data strobe signal output unit 20.

The phase detection unit 14 detects a phase difference between the replica data strobe signal DQR and the external clock signal CLK and outputs the control signal con for adjusting the delay time tDLL of the delay unit 12. More specifically, if the phase of the replica data strobe signal DQR leads the external clock signal CLK, the delay time tDLL is increased to allow the phase of the internal clock signal ICLK to lag behind, so that the phase of the replica data strobe signal DQR can lag behind. On the contrary, if the phase of the replica data strobe signal DQR lags behind the external clock signal CLK, the delay time tDLL is decreased to allow the phase of the internal clock signal ICLK to lead, so that the phase of the replica data strobe signal DQR can lead.

In other words, the internal clock generation unit 10 delays the external clock signal CLK so that the phases of the replica data strobe signal DQR and the external clock signal CLK can be equal to each other, and generates the internal clock signal ICLK. If the delay time tCLK of the data strobe signal output unit 20 and the delay time tREP of the data strobe signal replication unit 30 are equal to each other, the phases of the replica data strobe signal DQR and the data strobe signal DQS are also equal to each other, so that the phases of the replica data strobe signal DQR and the data signal DQ are equal to each other. Therefore, if the internal clock signal ICLK is generated as described above, the phase of the data signal DQ can be synchronized with the external clock signal CLK.

In other words, in order to synchronize the data signal DQ and the external clock signal CLK, the delay time tCLK of the data strobe signal output unit 20 and the delay time tREP of the data strobe signal replication unit 30 must be equal to each other. If the two delay times tCLK and tREP are different from each other, the data signal DQ and the external clock signal CLK are not synchronized with each other. As a result, there may occur mis-operation in other semiconductor devices receiving the data signal DQ in accordance with the external clock signal CLK. The process for equalizing the two delay times tCLK and tREP is not a simple one.

Figure 3A:
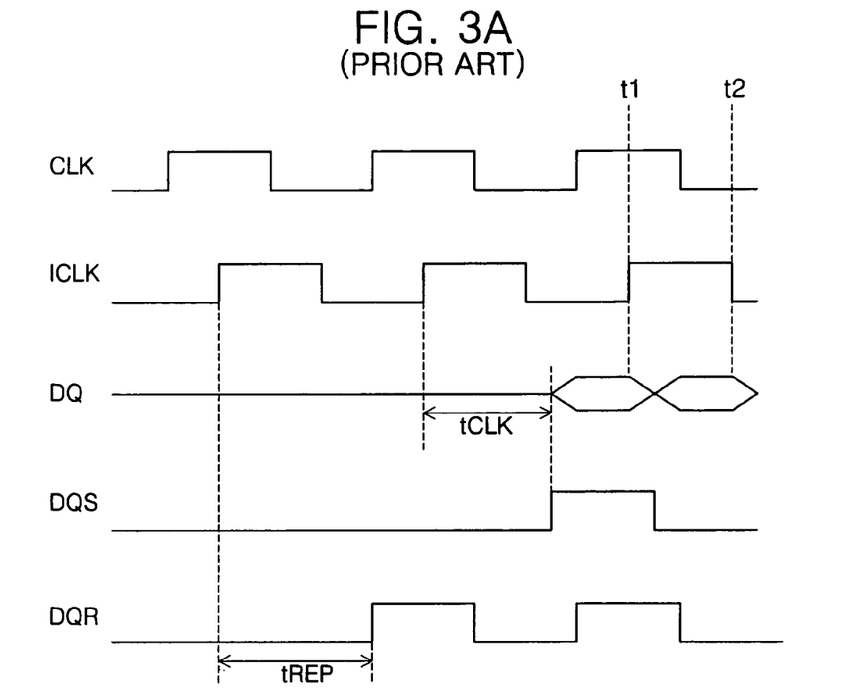
Figure 3B:
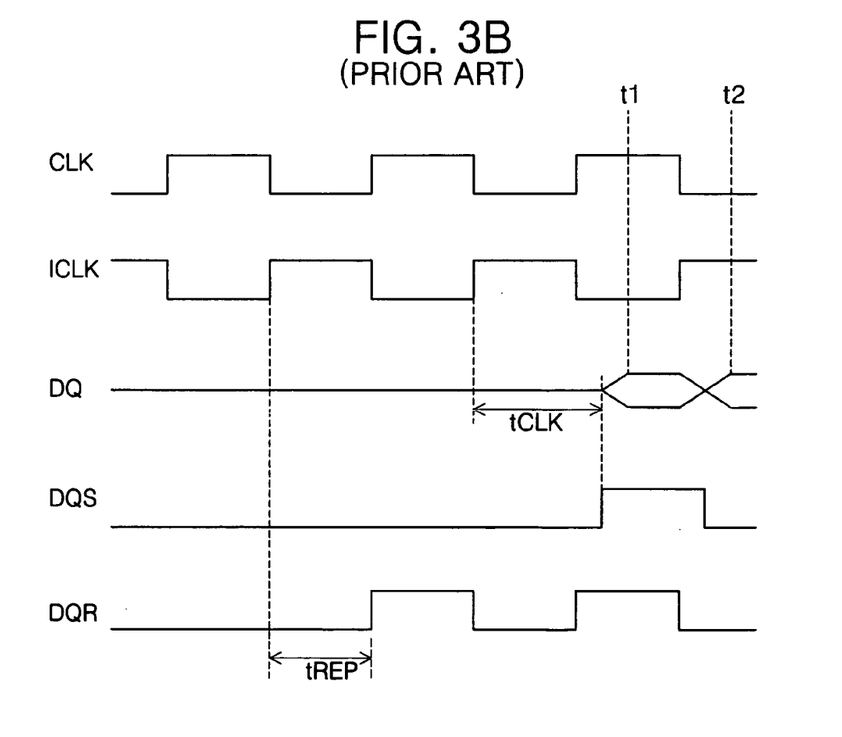

FIG. 3 is an operational timing diagram showing cases where the delay time tCLK of the data strobe signal output unit 20 and the delay time tREP of the data strobe signal replication unit 30 are different from each other. FIG. 3A shows a case where the delay time tREP of the data strobe signal replication unit 30 is longer than the delay time tCLK of the data strobe signal output unit 20, and FIG. 3B shows a case where the delay time tREP of the data strobe signal replication unit 30 is shorter than the delay time tCLK of the data strobe signal output unit 20.

Firstly, referring to FIG. 3A, in a case where the delay time tREP of the data strobe signal replication unit 30 is longer than the delay time tCLK of the data strobe signal output unit 20, the phase of the internal clock signal ICLK leads, so that the output time point of the data signal DQ can lead. If a different semiconductor device receiving the output data signal DQ senses the data signal DQ at intermediate time points t1 and t2 of the external clock signal CLK, invalid data may be sensed as shown in FIG. 3A.

Next, referring to FIG. 3B, in a case where the delay time tREP of the data strobe signal replication unit 30 is shorter than the delay time tCLK of the data strobe signal output unit 20, the phase of the internal clock signal ICLK lags behind, so that the output time point of the data signal DQ can lag behind. Similarly, if another semiconductor device receiving the output data signal DQ senses the data signal DQ at intermediate time points t1 and t2 of the external clock signal CLK, invalid data may be sensed as shown in FIG. 3B.

The aforementioned problem also occurs in a case where the other semiconductor device senses the data signal DQ at rising and falling edges of the external clock signal CLK. The problem becomes more serious as the operation speed of the semiconductor device increases. Therefore, it is important to equalize the delay time tREP of the data strobe signal replication unit 30 and the delay time tCLK of the data strobe signal output unit 20.

Conventionally, in order to equalize the delay time tREP of the data strobe signal replication unit 30 and the delay time tCLK of the data strobe signal output unit 20, modeling and simulation of the data strobe signal output unit 20 are performed to estimate the delay time tCLK of the data strobe signal output unit 20, and the delay time tREP of the data strobe signal replication unit 30 is determined with reference to the estimated value. In addition, in order to correct a modeling error and a process-changing error, options such as a fuse for adjusting the delay time tREP are provided to the data strobe signal replication unit 30, and the adjustments are made at a package level.

However, it is generally difficult to obtain an accurate modeling of the data strobe signal output unit 20. In addition, a large amount of time is required for performing the simulation using the modeling. In other words, the aforementioned conventional method has shortcomings in that it is difficult to accurately determine the delay time tREP of the data strobe signal replication unit 30 and too much time is required for an accurate determination of the delay time.

In addition, although the modeling error and the process-oriented error can be corrected at the package level, it is impossible to adjust a difference between a plurality of packages fabricated from a single, common wafer.

Therefore, in the conventional data output circuit, there is a high probability of errors occurring between the delay time tREP of the data strobe signal replication unit 30 and the delay time tCLK of the data strobe signal output unit 20. As a result, a semiconductor device receiving the output data may receive invalid data. These problems become more serious as the operation speed of the semiconductor device increases.

SUMMARY OF THE INVENTION

The present invention provides a data output circuit capable of automatically or more accurately equalizing a delay time of a data strobe signal replication unit and a delay time of a data strobe signal output unit.

The present invention also provides a data output method capable of automatically or more accurately equalizing a delay time of a data strobe signal replication unit and a delay time of a data strobe signal output unit.

The present invention also provides a semiconductor memory device capable of automatically or more accurately equalizing a delay time of a data strobe signal replication unit and a delay time of a data strobe signal output unit.

According to an aspect of the present invention, there is provided a data output circuit comprising: an internal clock generation unit that delays an external clock signal by a first delay time to output an internal clock signal in response to the external clock signal and a replica data strobe signal; a data strobe signal output unit that outputs a data strobe signal in response to the internal clock signal; and a data strobe signal replication unit that delays the internal clock signal by a second delay time to output the replica data strobe signal and that changes the second delay time in response to the data strobe signal and the replica data strobe signal.

In one embodiment, the internal clock generation unit comprises: a first phase detection unit that detects a phase difference of the external clock signal and the replica data strobe signal and that outputs a first control signal in response to the phase difference; and a first delay unit that changes the first delay time in response to the first control signal and that delays the external clock signal by the changed first delay time to output the internal clock signal.

In another embodiment, the data strobe signal replication unit comprises: a second phase detection unit that detects a phase difference of the data strobe signal and the replica data strobe signal and that outputs a second control signal in response to the phase difference; and a second delay unit that changes the second delay time in response to the second control signal and that delays the internal clock signal by the changed second delay time to output the replica data strobe signal.

In another embodiment, the second delay unit comprises: a shift register that outputs a delay time adjustment signal in response to the second control signal; and a delay cell array having a plurality of delay cells, selecting some of the delay cells in response to the delay time adjustment signal, and delaying the internal clock signal by using the selected delay cell to output the replica data strobe signal.

In another embodiment, the second delay unit comprises: a counter that up/down counts and outputs the delay time adjustment signal in response to the second control signal; a bias output unit that outputs a bias current in response to the delay time adjustment signal; and a delay cell that changes the delay time in response to the bias current and that delays the internal clock signal by the changed delay time to output the replica data strobe signal.

According to another aspect of the present invention, there is provided a data output method of a data output circuit comprising an internal clock generation unit that delays an external clock signal by a first delay time to generate an internal clock signal, a data strobe signal output unit that outputs a data strobe signal by using the internal clock signal, and a data strobe signal replication unit that delays the internal clock signal by a second delay time to output a replica data strobe signal, the method comprising: changing the second delay time in response to the data strobe signal and the replica data strobe signal; and changing the first delay time in response to the replica data strobe signal and the external clock signal.

In one embodiment, changing the second delay time in response to the data strobe signal and the replica data strobe signal comprises: detecting a phase difference between the data strobe signal and the replica data strobe signal and outputting a control signal in response to the phase difference; and changing the second delay time in response to the control signal and delaying the internal clock signal by the second delay time to output the replica data strobe signal.

In another embodiment, changing the second delay time in response to the control signal and delaying the internal clock signal by the second delay time to output the replica data strobe signal may comprise: outputting a delay time adjustment signal in response to the control signal; and selecting some of a plurality of the delay cells in response to the delay time adjustment signal and outputting the replica data strobe signal by using the selected delay cells, thereby changing the second delay time.

In another embodiment, changing the second delay time in response to the control signal and delaying the internal clock signal by the second delay time to output the replica data strobe signal may comprise: up/down counting a delay time adjustment signal in response to the control signal; changing and outputting a bias current in response to the delay time adjustment signal; and changing the second delay time by using the bias current.

According to still another aspect of the present invention, there is provided a semiconductor memory device comprising: an internal clock generation unit that delays an external clock signal by a first delay time to output an internal clock signal in response to the external clock signal and a replica data strobe signal; a memory cell array having a plurality of memory cells to output data in response to an externally input read command; a data output unit that inputs the data and that outputs output data, the data output unit outputting a data strobe signal in response to the internal clock signal; and a data strobe signal replication unit that delays the internal clock signal by a second delay time to output the replica data strobe signal and that changes the second delay time in response to the data strobe signal and the replica data strobe signal.

In one embodiment, the internal clock generation unit comprises: a first phase detection unit that detects a phase difference of the external clock signal and the replica data strobe signal and that outputs a first control signal in response to the phase difference; and a first delay unit that changes the first delay time in response to the first control signal and that delays the external clock signal by the changed first delay time to output the internal clock signal.

In another embodiment, the data strobe signal replication unit comprises: a second phase detection unit that detects a phase difference of the data strobe signal and the replica data strobe signal and that outputs a second control signal in response to the phase difference; and a second delay unit that changes the second delay time in response to the second control signal and that delays the internal clock signal by the changed second delay time to output the replica data strobe signal.

In another embodiment, the second delay unit comprises: a shift register that outputs a delay time adjustment signal in response to the second control signal; and a delay cell array having a plurality of delay cells, selecting some of the delay cells in response to the delay time adjustment signal, and delaying the internal clock signal by using the selected delay cells to output the replica data strobe signal.

In another embodiment, the second delay unit comprises: a counter that up/down counts and outputs the delay time adjustment signal in response to the second control signal; a bias output unit that outputs a bias current in response to the delay time adjustment signal; and a delay cell that changes the delay time in response to the bias current and that delays the internal clock signal by the changed delay time to output the replica data strobe signal.

BRIEF DESCRIPTION OF THE DRAWINGS

The above and other features and advantages of the present invention will become more apparent by describing in detail exemplary embodiments thereof with reference to the attached drawings in which:

FIG. 3 consisting of FIGS. 3A and 3B, is an operational timing diagram for explaining problems occurring in a case where a delay time of a data strobe signal replication unit and a delay time of data output unit are different from each other for the conventional data output circuit shown in FIG. 1;

DETAILED DESCRIPTION OF THE INVENTION

Now, a data output circuit according to the present invention will be described with reference to the accompanying drawings.

Figure 4:
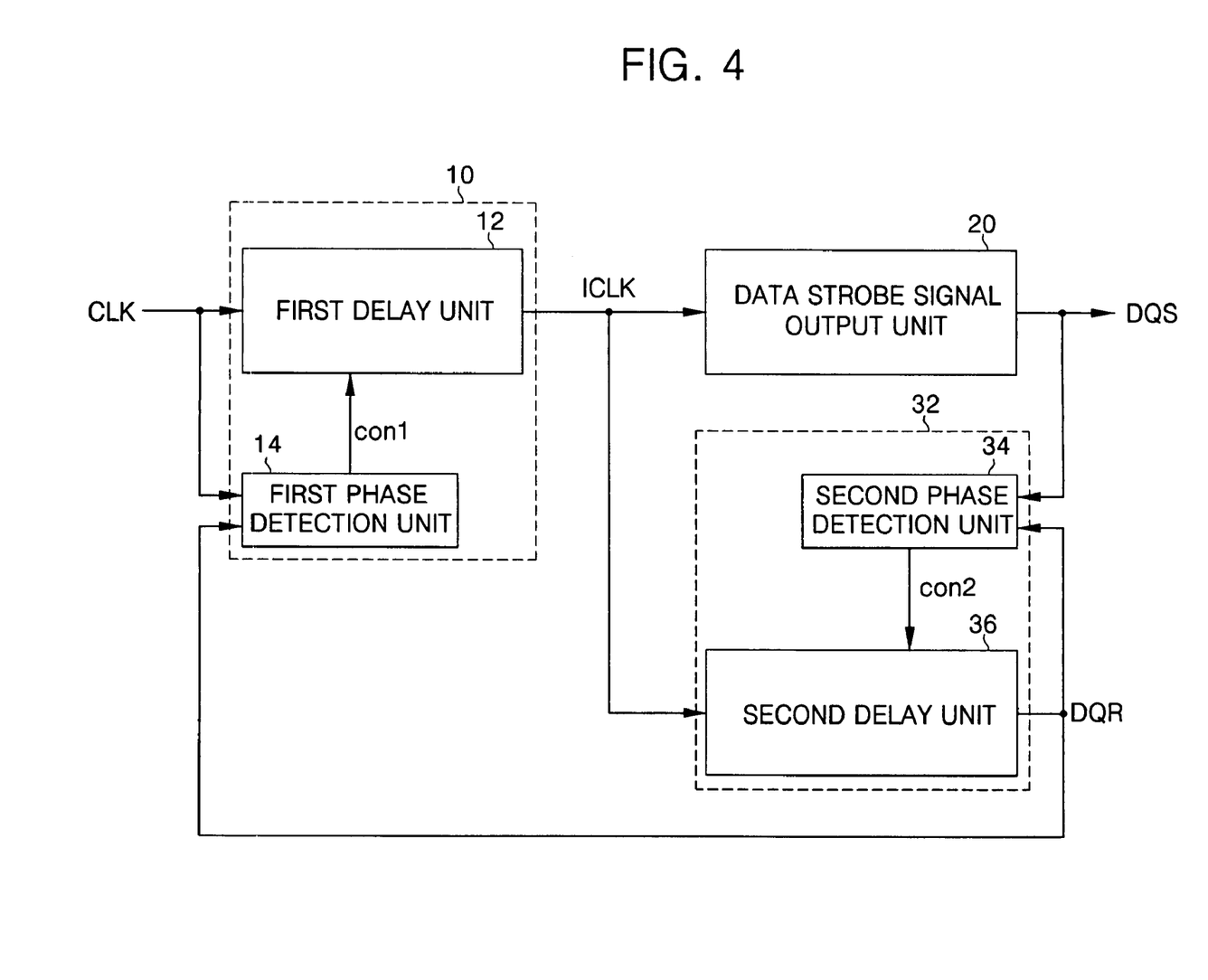
FIG. 4 is a block diagram of a data output circuit according to the present invention.

FIG. 4 is a block diagram of a data output circuit according to the present invention. The data output device comprises an internal clock generation unit 10, a data strobe signal output unit 20, and data strobe signal replication unit 32. The internal clock generation unit 10 comprises a first delay unit 12 and a first phase detection unit 14, and the data strobe signal replication unit 32 comprises a second phase detection unit 34 and a second delay unit 36.

Now, functions of the blocks shown in FIG. 4 will be described.

The functions of the internal clock generation unit 10 and the data strobe signal output unit 20 are the same as those described in FIG. 1, and the functions of the first delay unit 12 and the first phase detection unit 14 in the internal clock generation unit 10 are the same as those of the delay unit 12 and the phase detection unit 14 described in FIG. 1.

In response to a data strobe signal DQS and a replica data strobe signal DQR, the data strobe signal replication unit 32 delays the internal clock signal by a second delay time to output a replica data strobe signal. At this time, the second delay time varies in response to the data strobe signal DQS and the replica data strobe signal DQR.

The second phase detection unit 34 detects a phase difference between the data strobe signal DQS output from the data strobe signal output unit 20 and the replica data strobe signal DQR output from the data strobe signal replication unit 32 and outputs a control signal con2. In order to adjust a delay time of the first delay unit 12 in the first phase detection unit 14, before the control signal con1 is output, the second phase detection unit 34 detects a phase difference between the data strobe signal DQS and the replica data strobe signal DQR and outputs the control signal con2.

The data strobe signal replication unit 32 delays the internal clock signal ICLK output from the internal clock generation unit 10 by the second delay time to output the replica data strobe signal DQR. At this time, the second delay time changes by an amount that is controlled according to the control signal con2 output from the second phase detection unit 34.

More specifically, the data output device according to the present invention shown in FIG. 4 compares the phase of the replica data strobe signal DQR output from data strobe signal replication unit 32 and the phase of the data strobe signal DQS output from the data strobe signal output unit 20 and adjusts the delay time of the data strobe signal replication unit 32, so that the phase of two signals DQR and DQS are equal to each other. Therefore, the delay time of the data strobe signal replication unit 32 and the delay time of the data strobe signal output unit 20 can be equal to each other.

As a result, there is no need to perform a modeling and simulation for the data strobe signal output unit 20, and thus it is possible to save time and effort required for adjusting the delay time of the data strobe signal replication unit 32. In addition, since the delay time of the second delay unit 36 can be adjusted for individual packages at the package level, it is possible to adjust the delay time of the second delay unit 36 for the individual packages without consideration of a package difference.

Figure 5:
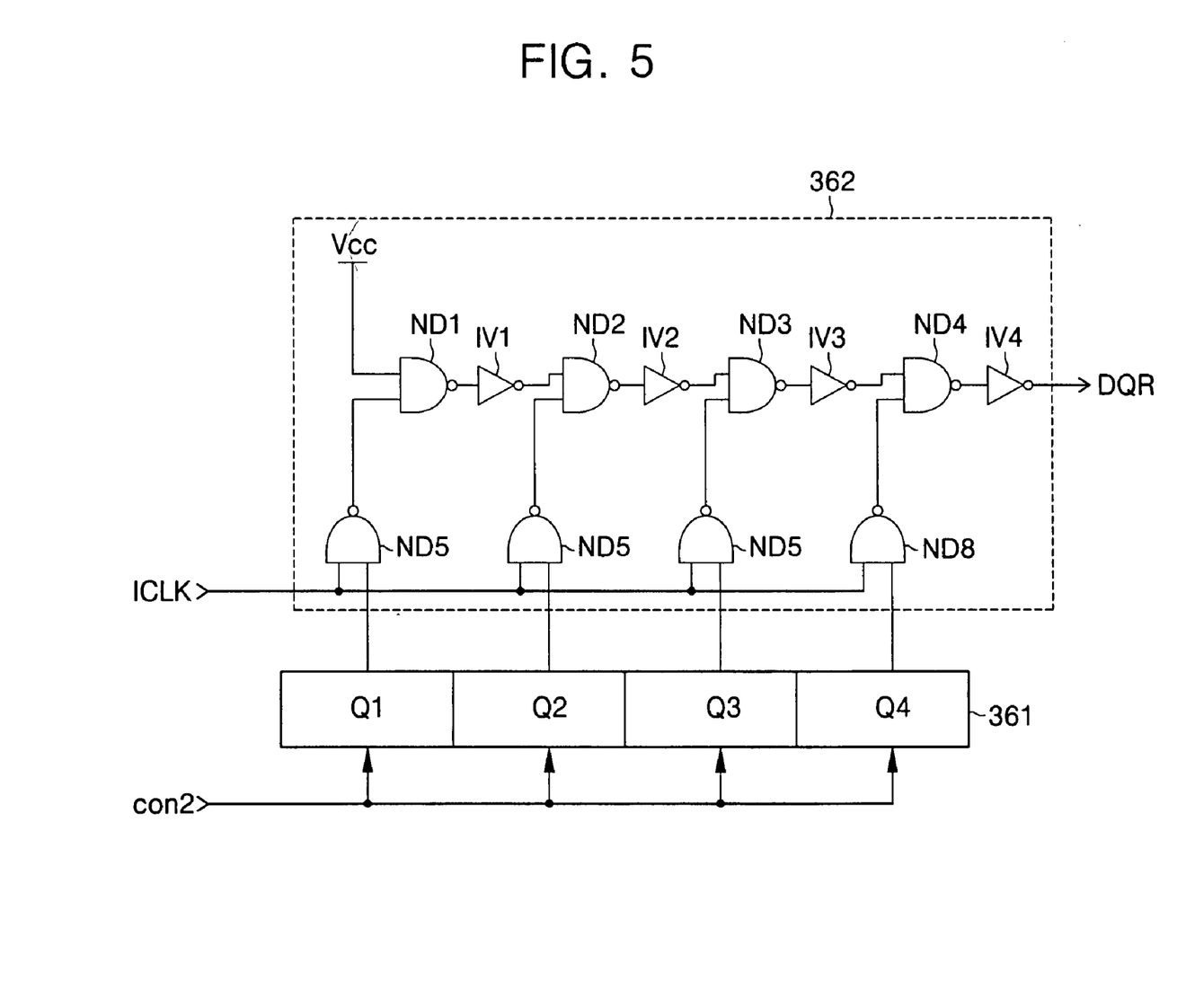
FIG. 5 is a block diagram of a first embodiment of a second delay unit of a data strobe signal replication unit of the data output circuit according to the present invention shown in FIG. 4.

FIG. 5 is a block diagram showing a first embodiment of a second delay unit 36 of a data strobe signal replication unit 32 of the data output circuit according to the present invention shown in FIG. 4. The second delay unit 36 comprises a shift register 361 and a delay cell array 362.

Now, functions of the blocks shown in FIG. 5 will be described.

The shift register 361 outputs a delay time adjustment signal in response to a second control signal con2 output from the second phase detection unit 34. More specifically, the shift register 361 outputs a high level output signal through one of four output ports Q1~Q4 and low level output signals through the other ports. The port for outputting the high level output signal is selected by the second control signal con2.

The delay cell array 362 comprises four delay cells IV1~IV4 and eight NAND gates ND1~ND8. The delay cell array 362 selects some of the delay cells in response to the delay time adjustment signal and delays the internal clock signal ICLK by the second delay time by using the selected delay cells to output the replica data strobe signal DQR.

Although FIG. 5 exemplifies a case of four delay cells, a different number of delay cells can be employed, depending on the application.

Now, operation of the second delay unit 36 according to the first embodiment of the present invent shown in FIG. 5 will be described.

If the phase of the replica data strobe signal DQR leads the phase of the data strobe signal DQS, the second phase detection unit 34 outputs the second control signal con2 to shift the port for outputting the high level output signal to the left side in the shift register 361. On the contrary, if the phase of the replica data strobe signal DQR lags behind the phase of the data strobe signal DQS, the second phase detection unit 34 outputs the second control signal con2 to shift the port for outputting the high level output signal to the right side in the shift register 361. When the port for outputting the high level output signal in the shift register 361 is shifted to the right side, the internal clock signal ICLK passes through a smaller number of the delay cells, so that the delay time can decrease. On the contrary, when the port for outputting the high level output signal in the shift register 361 is shifted to the left side, the internal clock signal ICLK passes through a larger number of the delay cells, so that the delay time can increase.

For example, in a case where the high level output signal is output through the port Q1 of the shift register 361, the internal clock signal ICLK passes through the four delay cells IV1~IV4, so that the delay time can relatively increase. However, in a case where the high level output signal is output through the port Q4 of the shift register 361, the internal clock signal ICLK passes through the one delay cell IV4, so that the delay time can relatively decrease. By using the aforementioned method, the delay time of the second delay unit 36 can change.

Figure 6:
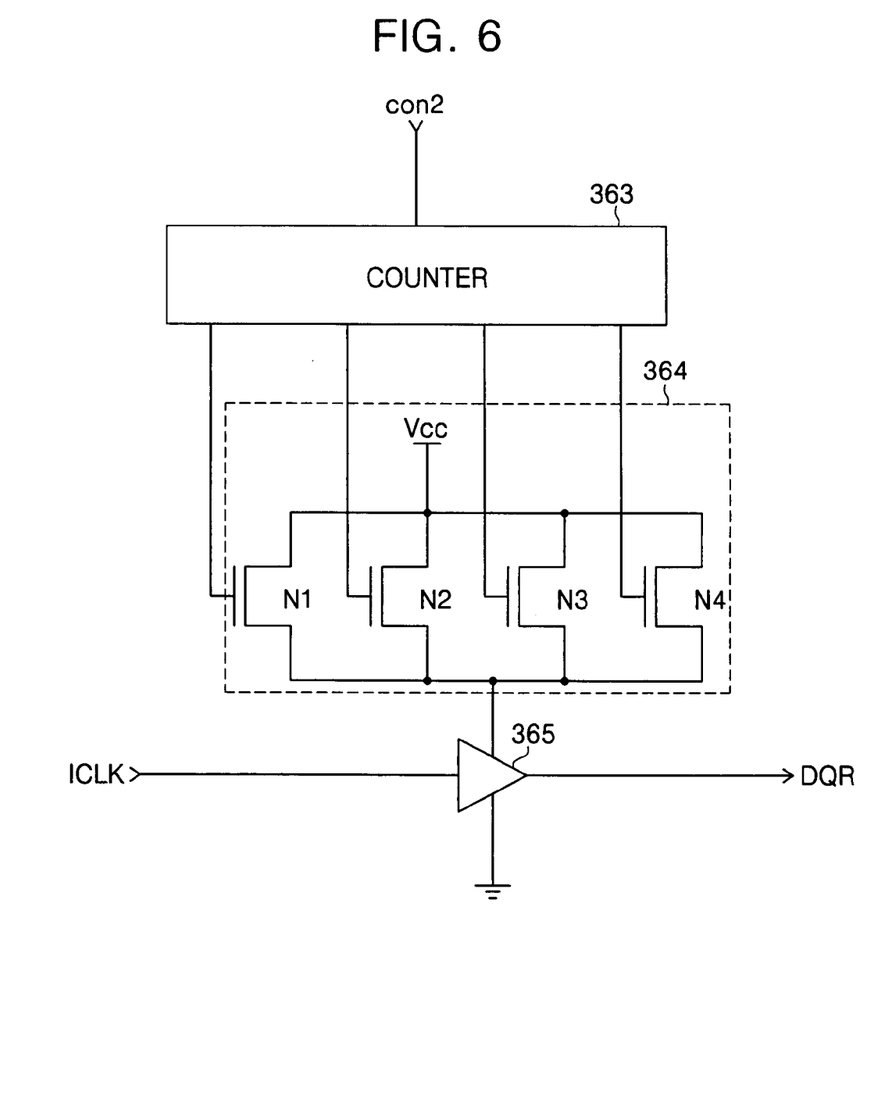
FIG. 6 is a block diagram of a second embodiment of a second delay unit of a data strobe signal replication unit of the data output circuit according to the present invention shown in FIG. 4.

FIG. 6 is a block diagram showing a second embodiment of a second delay unit 36 of a data strobe signal replication unit 32 of the data output circuit according to the present invention shown in FIG. 4. The second delay unit 36 comprises a counter 363, a bias output unit 364, and a delay cell 365.

Now, the functions of the blocks shown in FIG. 6 will be described.

The counter 363 outputs the delay time adjustment signal in response to the second control signal con2 output from the second phase detection unit 34. More specifically, the counter 363 increases or decreases a value of the delay time adjustment signal having a binary code format or a thermometer code format in response to the second control signal con2.

The bias output unit 364 changes a bias current output in response to the delay time adjustment signal. More specifically, NMOS transistors N1~N4 constituting the bias output unit 364 are turned on or off in response to bits of the delay time adjustment signal. It can be understood that the magnitude of the bias current output from the bias output unit 364 in a case where the two transistors N3 and N4 are turned on is larger than that of a case where the only one transistor N4 is turned on. Therefore, the magnitude of the bias current output from the bias output unit 364 can change according to the delay time adjustment signal.

The delay cell 365 delays the internal clock signal ICLK by the second delay time to output the replica data strobe signal DQR. The second delay time changes according to the magnitude of the bias current.

More specifically, as shown in FIG. 6, in the second embodiment of the second delay unit 36 of the data output circuit according to the present invention, the second delay unit 36 changes the bias current according to the second control signal con2 output from the second phase detection unit 34 and adjusts the delay time of the second delay unit 36 by using the delay cell of which delay time changes in response to the bias current, so that the delay time of the data strobe signal replication unit 32, that is, the second delay time, can change.

Figure 7:
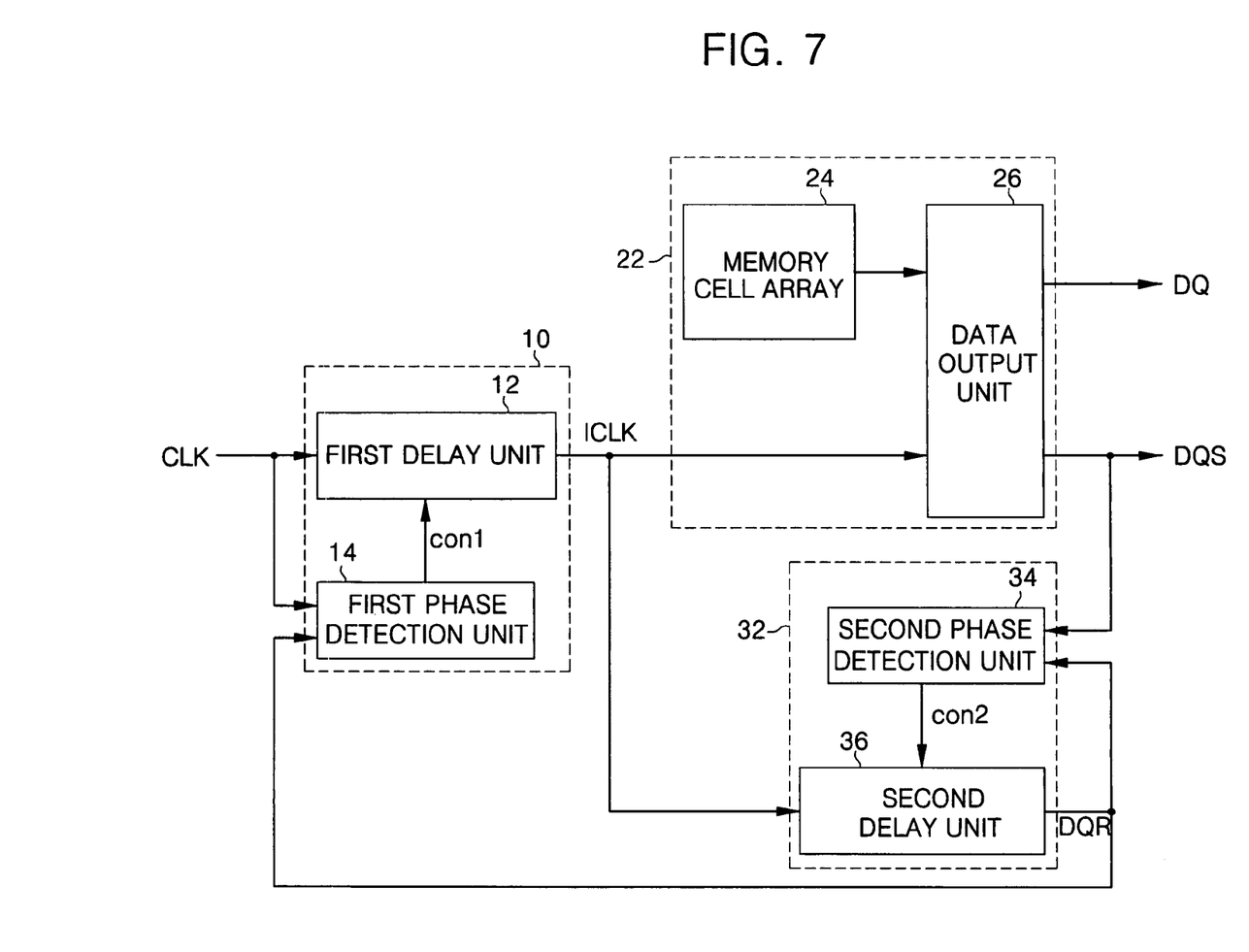
FIG. 7 is a block diagram of a semiconductor memory device according to the present invention.

FIG. 7 is a block diagram showing a semiconductor memory device according to the present invention. The semiconductor memory device comprises an internal clock generation unit 10, a memory unit 22, and a data strobe signal replication unit 32. The internal clock generation unit 10 comprises a first delay unit 12 and a first phase detection unit 14; the memory unit 22 comprises a memory cell array 24 and a data output unit 26; and the data strobe signal replication unit 32 comprises a second phase detection unit 34 and a second delay unit 36.

Now, functions of the blocks shown in FIG. 7 will be described.

The functions of the internal clock generation unit 10 and the first delay unit 12 and the first phase detection unit 14 in the internal clock generation unit 10 are the same as described with reference to FIGS. 1 and 4.

The functions of the data strobe signal replication unit 32 and the second phase detection unit 34 and the second delay unit 36 in the data strobe signal replication unit 32 are the same as described with reference to FIG. 4. The second delay unit 36 can be implemented, for example, according to the constructions shown in FIGS. 5 and 6.

The memory unit 22 outputs the data signal DQ and the data strobe signal DQS in response to a read command externally input.

The memory cell array 24 is constructed with a plurality of memory cells. The memory cell array 24 outputs data in response to the externally input read command.

The data output unit 26 inputs the data output from the memory cell array 24. The data output unit 26 outputs the data signal DQ and the data strobe signal DQS in response to the internal clock signal ICLK output from the internal clock generation unit 10. At this time, the phases of the data signal DQ and the data strobe signal DQS are equal to each other.

In other words, the semiconductor memory device according to the present invention shown in FIG. 7 is constructed to automatically adjust the delay time of the second delay unit 36 by using the data strobe signal DQS. Therefore, in the data strobe signal replication unit 32, the second delay time for delaying the internal clock signal ICLK can be automatically adjusted.

Although FIG. 7 exemplifies a case where the data output circuit according to the present invention is applied to a semiconductor memory device, it can be understood that the data output circuit according to the present invention can be applied to any type of synchronized semiconductor device.

Namely, the data output circuit according to the present invention automatically adjusts the delay time of the data strobe signal replication unit 32, so that it is possible to reduce the time and effort required for setting the delay time of the data strobe signal replication unit 32. In addition, it is possible to correct all the package differences of the delay time of the data output unit 26.

While the present invention has been particularly shown and described with reference to exemplary embodiments thereof, it will be understood by those skilled in the art that various changes in form and details may be made herein without departing from the spirit and scope of the present invention as defined by the appended claims.

Accordingly, in a data output circuit according to the present invention, it is possible to save time and effort, required for setting a delay time of a data strobe signal replication unit. In addition, it is possible to correct package differences of the delay time of the data strobe signal output unit.

What is claimed is:

1. A data output circuit comprising:
    an internal clock generation unit that delays an external clock signal by a first delay time to output an internal clock signal in response to the external clock signal and a replica data strobe signal;
    a data strobe signal output unit that outputs a data strobe signal in response to the internal clock signal; and
    a data strobe signal replication unit that delays the internal clock signal by a second delay time to output the replica data strobe signal and that changes the second delay time in response to the data strobe signal and the replica data strobe signal.

2. The data output circuit according to claim 1, wherein the internal clock generation unit comprises:
    a first phase detection unit that detects a phase difference of the external clock signal and the replica data strobe signal and that outputs a first control signal in response to the phase difference; and
    a first delay unit that changes the first delay time in response to the first control signal and that delays the external clock signal by the changed first delay time to output the internal clock signal.

3. The data output circuit according to claim 1, wherein the data strobe signal replication unit comprises:
    a second phase detection unit that detects a phase difference of the data strobe signal and the replica data strobe signal and that outputs a second control signal in response to the phase difference; and
    a second delay unit that changes the second delay time in response to the second control signal and that delays the internal clock signal by the changed second delay time to output the replica data strobe signal.

4. The data output circuit according to claim 3, wherein the second delay unit comprises:
    a shift register that outputs a delay time adjustment signal in response to the second control signal; and
    a delay cell array having a plurality of delay cells, selecting some of the delay cells in response to the delay time adjustment signal, and delaying the internal clock signal by using the selected delay cell to output the replica data strobe signal.

5. The data output circuit according to claim 3, wherein the second delay unit comprises:

a counter that up/down counts and outputs the delay time adjustment signal in response to the second control signal;

a bias output unit that outputs a bias current in response to the delay time adjustment signal; and a delay cell that changes the delay time in response to the bias current and that delays the internal clock signal by the changed delay time to output the replica data strobe signal.

6. A data output method of a data output circuit comprising an internal clock generation unit that delays an external clock signal by a first delay time to generate an internal clock signal, a data strobe signal output unit that outputs a data strobe signal by using the internal clock signal, and a data strobe signal replication unit that delays the internal clock signal by a second delay time to output a replica data strobe signal, the method comprising:

changing the second delay time in response to the data strobe signal and the replica data strobe signal; and changing the first delay time in response to the replica data strobe signal and the external clock signal.

7. The data output method according to claim 6, wherein changing the second delay time in response to the data strobe signal and the replica data strobe signal comprises:

detecting a phase difference between the data strobe signal and the replica data strobe signal and outputting a control signal in response to the phase difference; and changing the second delay time in response to the control signal and delaying the internal clock signal by the second delay time to output the replica data strobe signal.

8. The data output method according to claim 7, wherein changing the second delay time in response to the control signal and delaying the internal clock signal by the second delay time to output the replica data strobe signal comprises:

outputting a delay time adjustment signal in response to the control signal; and selecting some of a plurality of the delay cells in response to the delay time adjustment signal and outputting the replica data strobe signal by using the selected delay cells, thereby changing the second delay time.

9. The data output method according to claim 7, wherein changing the second delay time in response to the control signal and delaying the internal clock signal by the second delay time to output the replica data strobe signal comprises:

up/down counting a delay time adjustment signal in response to the control signal;

changing and outputting a bias current in response to the delay time adjustment signal; and changing the second delay time by using the bias current.

10. A semiconductor memory device comprising:

an internal clock generation unit that delays an external clock signal by a first delay time to output an internal clock signal in response to the external clock signal and a replica data strobe signal;

a memory cell array having a plurality of memory cells to output data in response to an externally input read command;

a data output unit that inputs the data and that outputs output data, the data output unit outputting a data strobe signal in response to the internal clock signal; and a data strobe signal replication unit that delays the internal clock signal by a second delay time to output the replica data strobe signal and that changes the second delay time in response to the data strobe signal and the replica data strobe signal.

11. The semiconductor memory device according to claim 10, wherein the internal clock generation unit comprises:

a first phase detection unit that detects a phase difference of the external clock signal and the replica data strobe signal and that outputs a first control signal in response to the phase difference; and a first delay unit that changes the first delay time in response to the first control signal and that delays the external clock signal by the changed first delay time to output the internal clock signal.

12. The semiconductor memory device according to claim 10, wherein the data strobe signal replication unit comprises:

a second phase detection unit that detects a phase difference of the data strobe signal and the replica data strobe signal and that outputs a second control signal in response to the phase difference; and a second delay unit that changes the second delay time in response to the second control signal and that delays the internal clock signal by the changed second delay time to output the replica data strobe signal.

13. The semiconductor memory device according to claim 12, wherein the second delay unit comprises:

a shift register that outputs a delay time adjustment signal in response to the second control signal; and a delay cell array having a plurality of delay cells, selecting some of the delay cells in response to the delay time adjustment signal, and delaying the internal clock signal by using the selected delay cells to output the replica data strobe signal.

14. The semiconductor memory device according to claim 12, wherein the second delay unit comprises:

a counter that up/down counts and outputs the delay time adjustment signal in response to the second control signal;

a bias output unit that outputs a bias current in response to the delay time adjustment signal; and a delay cell that changes the delay time in response to the bias current and that delays the internal clock signal by the changed delay time to output the replica data strobe signal.

* * * * *